(12) United States Patent
Song et al.

(10) Patent No.: US 10,014,353 B2
(45) Date of Patent: Jul. 3, 2018

(54) SUBSTRATE, DISPLAY DEVICE HAVING THE SAME, AND FABRICATING METHOD THEREOF

(71) Applicant: BOE TECHNOLOGY GROUP CO., LTD., Beijing (CN)

(72) Inventors: Yingying Song, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 15/035,757

(22) PCT Filed: Dec. 28, 2015

(86) PCT No.: PCT/CN2015/099131
§ 371 (c)(1),
(2) Date: May 11, 2016

(87) PCT Pub. No.: WO2016/192385
PCT Pub. Date: Dec. 8, 2016

(65) Prior Publication Data
US 2017/0104044 A1 Apr. 13, 2017

(30) Foreign Application Priority Data
Jun. 4, 2015 (CN) .......................... 2015 1 0303029

(51) Int. Cl.
*H01L 29/08* (2006.01)
*H01L 21/00* (2006.01)
(Continued)

(52) U.S. Cl.
CPC ...... *H01L 27/3246* (2013.01); *H01L 27/3276* (2013.01); *H01L 51/0004* (2013.01);
(Continued)

(58) Field of Classification Search
CPC . H01L 27/3246; H01L 51/5234; H01L 51/56; H01L 51/005; H01L 27/3276; H01L 2227/323; H01L 51/0002; H01L 27/326
(Continued)

(56) References Cited

U.S. PATENT DOCUMENTS

2003/0143339 A1 7/2003 Kobayashi
2005/0139576 A1 6/2005 Kim
(Continued)

FOREIGN PATENT DOCUMENTS

CN 1892981 A 1/2007
CN 101114598 A 1/2008
(Continued)

OTHER PUBLICATIONS

English machine translation of Chinese Patent CN103753784(A) by Liu et al. Date Apr. 30, 2014.*
(Continued)

*Primary Examiner* — Thinh T Nguyen
(74) *Attorney, Agent, or Firm* — INTELLECTUAL VALLEY LAW, P.C.

(57) ABSTRACT

The present application discloses a substrate comprising a via and a lyophobic protrusion layer comprising a plurality of protrusions spaced apart in the via, each of the plurality of protrusions protruding from a bottom surface of the via.

20 Claims, 4 Drawing Sheets

(51) Int. Cl.
*H01L 27/32* (2006.01)
*H01L 51/56* (2006.01)
*H01L 51/00* (2006.01)
*H01L 51/52* (2006.01)

(52) U.S. Cl.
CPC ...... *H01L 51/0005* (2013.01); *H01L 51/5234* (2013.01); *H01L 51/56* (2013.01); *H01L 2227/323* (2013.01)

(58) Field of Classification Search
USPC ....... 257/40, 59, 72, 81; 438/82, 99, 48, 128
See application file for complete search history.

(56) References Cited

U.S. PATENT DOCUMENTS

| | | | | |
|---|---|---|---|---|
| 2008/0056945 | A1* | 3/2008 | Hattori | B01J 19/0093 422/68.1 |
| 2014/0139102 | A1 | 5/2014 | Jeon et al. | |
| 2014/0145171 | A1* | 5/2014 | Park | H01L 27/3276 257/40 |
| 2016/0155787 | A1* | 6/2016 | Lee | H01L 51/5262 257/72 |
| 2016/0179229 | A1* | 6/2016 | Ahn | G06F 3/041 345/173 |
| 2016/0365392 | A1* | 12/2016 | Li | H01L 51/56 |
| 2017/0104044 | A1* | 4/2017 | Song | H01L 51/56 |

FOREIGN PATENT DOCUMENTS

| | | |
|---|---|---|
| CN | 101796561 A | 8/2010 |
| CN | 103753984 A | 4/2014 |
| CN | 104882467 A | 9/2015 |

OTHER PUBLICATIONS

The First Office Action in the Chinese Patent Application No. 201510303029.1, dated May 26, 2017; English translation attached.
International Search Report & Written Opinion dated Mar. 25, 2016 regarding PCT/CN2015/099131.

* cited by examiner

SUBSTRATE, DISPLAY DEVICE HAVING THE SAME, AND FABRICATING METHOD THEREOF

CROSS-REFERENCE TO RELATED APPLICATION

This application is a national stage application under 35 U.S.C. § 371 of International Application No. PCT/CN2015/099131 filed Dec. 28, 2015, which claims priority to Chinese Patent Application No. 201510303029.1, filed Jun. 4, 2015, the contents of which are incorporated by reference in the entirety.

TECHNICAL FIELD

The present invention relates to display technology, more particularly, to a substrate, a display device having the same, and a fabricating method thereof.

BACKGROUND

Organic light emitting diodes (OLED) use the principles of electrophosphorescence to convert electrical energy in an OLED into light in a highly efficient manner. OLEDs are self-emitting apparatuses that do not require a backlight. Having the advantages of a wide viewing angle, high contrast, fast response, high flexibility, a wide working temperature, and a simpler structure and manufacturing process, they have found a wide range of applications in display field.

Organic material layers in an OLED substrate can be formed by depositing a liquid organic material onto the substrate by in-jet printing or coating. The printing method may be continuous or non-continuous. In a continuous printing process, the organic material can be applied using maskless, non-contact methods, and can be sequentially printed. Typically, the nozzle has a large opening which is not prone to clogging. The continuous printing is scalable and may be used for various ink compositions.

SUMMARY

In one aspect, the present invention provides a substrate comprising a via and a lyophobic protrusion layer comprising a plurality of protrusions spaced apart in the via, each of the plurality of protrusions protruding from a bottom surface of the via.

Optionally, ends of the plurality of protrusions distal to the bottom surface are substantially level with a surface of the substrate.

Optionally, the via is a cathode contact area in a peripheral region of an organic light emitting display; the substrate comprises a transparent conductive layer and the lyophobic protrusion layer within the via; the bottom surface of the via is the transparent conductive layer, ends of the plurality of protrusions proximal to the bottom surface are in contact with the transparent conductive layer; and in an area within the peripheral region and outside the via, the substrate comprises an insulating layer, a pixel definition layer, and the transparent conductive layer between the insulating layer and the pixel definition layer.

Optionally, the ends of the plurality of protrusions distal to the bottom surface are substantially level with a surface of the pixel definition layer outside the cathode contact area.

Optionally, the substrate further comprises a source/drain layer.

Optionally, the source/drain layer within the via is on a side of the transparent conductive layer distal to the lyophobic protrusion layer, the source/drain layer is in contact with the transparent conductive layer; and the source/drain layer outside the via is on a side of the insulating layer distal to the transparent conductive layer.

Optionally, the substrate further comprises a cathode material layer on a side of the lyophobic protrusion layer distal to the transparent conductive layer, the cathode material layer extending through a space in between the plurality of protrusions and in contact with the transparent conductive layer.

Optionally, the substrate further comprises an anode layer, a cathode layer, and a light emitting layer between the anode layer and the cathode layer within a display region of the organic light emitting display, the cathode layer is in a same layer as the cathode material layer.

Optionally, the anode layer is in a same layer as the transparent conductive layer.

Optionally, a distance between two ends of the plurality of protrusions distal to the bottom surface is in the range of about 6 μm to about 10 μm.

Optionally, the distance is in the range of about 7 μm to about 8 μm.

Optionally, the lyophobic material is a same material as that of a pixel definition layer.

Optionally, the lyophobic material is a fluorine containing organic polymer.

Optionally, each of the plurality of protrusions has a convex circular curvature.

Optionally, the cross-section of each of the plurality of protrusions has an undulation configuration.

In another aspect, the present invention provides a method of fabricating a substrate, comprising forming a via and forming a lyophobic protrusion layer comprising a plurality of protrusions spaced apart in the via, each of the plurality of protrusions protruding from a bottom surface of the via.

Optionally, the method further comprises forming a light emitting layer on the substrate by a printing or coating process.

Optionally, ends of the plurality of protrusions distal to the bottom surface are substantially level with a surface of the substrate.

Optionally, the via is a cathode contact area in a peripheral region of an organic light emitting display; prior to forming the lyophobic protrusion layer, the method further comprises forming a source/drain layer on the substrate; forming an insulating layer on the source/drain layer; removing the insulating layer in an area corresponding to the cathode contact area; forming a transparent conductive layer on a side of the insulating layer distal to the source/drain layer outside the via, and over and in contact with the source/drain layer within the via; patterning the transparent conductive layer outside the via to form an anode layer; forming a pixel definition layer on a side of the transparent conductive layer distal to the source/drain layer; and removing a least a portion of the pixel definition layer in the area corresponding to the via.

Optionally, ends of the plurality of protrusions proximal to the bottom surface are in contact with the transparent conductive layer.

Optionally, ends of the plurality of protrusions distal to the bottom surface are substantially level with a surface of the pixel definition layer outside the cathode contact area.

Optionally, the lyophobic material is a same material as that of a pixel definition layer, the step of forming the lyophobic protrusion layer comprises patterning the pixel definition layer in the area corresponding to the via to form the plurality of protrusions.

Optionally, the method further comprises forming a light emitting layer on the substrate by a printing or coating process on a side of the pixel definition layer distal to the source/drain layer.

Optionally, the method further comprises forming a cathode material layer in the via on a side of the lyophobic protrusion layer distal to the transparent conductive layer, the cathode material layer extending through a space in between the plurality of protrusions and in contact with the transparent conductive layer.

Optionally, the method further comprises forming a cathode layer on a side of the pixel definition layer distal to the source/drain layer, wherein the cathode layer is formed in a same process as the cathode material layer.

In another aspect, the present invention provides a display device comprising a substrate as described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Organic material layers in an OLED substrate can be formed by depositing a liquid organic material onto the substrate by in-jet printing or coating. However, during in jet printing or coating, the ink or coating material may contaminate areas where the organic material is not desired. For example, a peripheral region of a substrate (see region 11 in FIG. 1) may be contaminated during the printing or coating process. Therefore, the contaminated areas need to be cleaned after the printing or coating is finished. Methods such as plasma etching and laser cleaning may be used for removing organic material deposited in the peripheral region of a substrate. However, these methods do not work for cleaning a via (including a recessed region such as a trench, or a porous structure), particularly structures having a size in micro-meter scale.

The present disclosure provides a superior substrate that overcomes the problems associated with conventional substrate. In one aspect, the present disclosure provides a plurality of lyophobic protrusions in vias (including a recessed region such as a trench, or a porous structure). The lyophobic protrusions are made of a lyophobic material, coated with a lyophobic material, or otherwise treated to be lyophobic. The lyophobic material repels the ink used in a printing process or the coating material used in a coating process. By having a plurality of lyophobic protrusions, the contamination within the vias (including a recessed region such as a trench, or a porous structure) can be prevented, obviating the needs for a targeted cleaning within the via. The manufacturing process is thus significantly simplified, and defects in the substrate much reduced.

As defined herein, the term "lyophobic" refers to the repellant nature one material has for a solution. Optionally, the term lyophobic refers to a condition where a contact angle of about 40° or more is measured when an organic-compound-containing solution (e.g., a light emitting material solution, a hole transport material, a hole injection material, an electron transport material, an electron injection material, etc.) or a solvent for dissolving the organic compound (e.g., an organic solvent or water) is placed on a surface having the lyophobic material. Optionally, the term lyophobic refers to a condition where a contact angle of about 80° or more is measured when a droplet of water-based ink or coating solution is placed on a surface having the lyophobic material. Optionally, the term lyophobic refers to a condition where a contact angle of about 40° or more is measured when a droplet of organic solvent-based ink or coating solution is placed on a surface having the lyophobic material. Optionally, the term lyophobic refers to a condition where a solution is in contact with a surface having the lyophobic material by a Cassie-Baxter state.

In some embodiments, the substrate comprises a via and a lyophobic protrusion layer having a plurality of protrusions spaced apart in the via protruding from a bottom surface of the via. Optionally, the protrusion is made of a lyophobic material. Optionally, each of the plurality of protrusions has an end proximal to the bottom surface (e.g., in contact with) and an opposite end distal to the bottom surface.

Various embodiments of protrusion shape, dimension, and spacing can be practiced to increase the lyophobic effect. For example, the protrusion may have a convex circular curvature. Optionally, the protrusion has a tapered structure in which the end proximal to the bottom surface (e.g., in contact with) has a larger diameter than the end distal to the bottom surface. Optionally, the cross-section of the protrusion has an undulation configuration.

In some embodiments, the spacing between the plurality of protrusions is less than the size of an ink droplet to prevent the ink droplet entering the space between the protrusions. The smallest ink droplet used in a typical printing process has a droplet size of about 20 μm. Optionally, the distance between two ends of the protrusions distal to the bottom surface is less than 20 μm, e.g., about 5 μm to about 20 μm, about 5 μm to about 15 μm, or about 5 μm to about 10 μm. Optionally, the distance between two ends of the protrusions distal to the bottom surface is in the range of about 6 μm to about 10 μm, e.g., about 7 μm to about 8 μm.

Typically, the purpose for having a via such as a cathode contact area is to gain access to layers underneath the surface. The via (or a similar structure) acts as a conduit for accessing various layers otherwise blocked by insulating layers in the substrate. By having a via (or a similar structure) in place, the layers underneath the surface can be connected to wires. Accordingly, the present substrate has a plurality of protrusions spaced apart in the via for preventing contamination from ink or coating materials. Because the protrusions are spaced apart by an appropriate distance, the via can still function as a conduit for accessing the layers below. For example, in subsequent fabrication steps, the space in between the protrusions and above the protrusions can be filled with conductive materials, connecting various layers in the substrate to external wires.

In some embodiments, the ends of the protrusions distal to the bottom surface are substantially level with the surface of the substrate (e.g., a surface of the pixel definition layer). By having this design, it can prevent ink or coating material from entering into the via, and stay on the surface of the substrate, further facilitating the cleaning of the contamination by the ink or coating material.

In another aspect, the present disclosure provides a method of fabricating a substrate. In some embodiments, the method includes forming a via and forming a lyophobic protrusion layer having a plurality of protrusions spaced apart in the via and protruding from a bottom surface of the via. Optionally, the protrusion is made of a lyophobic material. Optionally, the protrusion has an end proximal to the bottom surface (e.g., in contact with) and an opposite end distal to the bottom surface.

The ink or coasting material during a printing or coating process is not desired in the position corresponding to the via. The lyophobic protrusions are made of a lyophobic material, coated with a lyophobic material, or otherwise treated to be lyophobic. The lyophobic material repels the ink or coating material. By having a plurality of lyophobic protrusions, the contamination within the via can be prevented, obviating the needs for a targeted cleaning within the via. The manufacturing process is thus significantly simplified, and defects in the substrate much reduced.

In some embodiments, the ends of the protrusions distal to the bottom surface are substantially level with the surface of the substrate (e.g., a surface of the pixel definition layer). By having this design, it can prevent ink or coating material from entering into the via, and stay on the surface of the substrate, further facilitating the cleaning of the contamination by the ink or coating material.

Optionally, the plurality of protrusions are formed in a same process as another layer. Optionally, the plurality of protrusions are formed in a separate process.

Based on the above, the present disclosure provides a method of fabricating a superior substrate. According to the method in some embodiments, a lyophobic protrusion layer having a plurality of protrusions spaced apart in a via is formed in the substrate. The lyophobic protrusions are made of a lyophobic material, coated with a lyophobic material, or otherwise treated to be lyophobic. The lyophobic material repels the ink or coating material. By having a plurality of lyophobic protrusions, the contamination within the via can be prevented, obviating the needs for a targeted cleaning within the via before the substrate is subject to subsequent processes. The manufacturing process is thus significantly simplified, and defects in the substrate much reduced.

Figure 1:
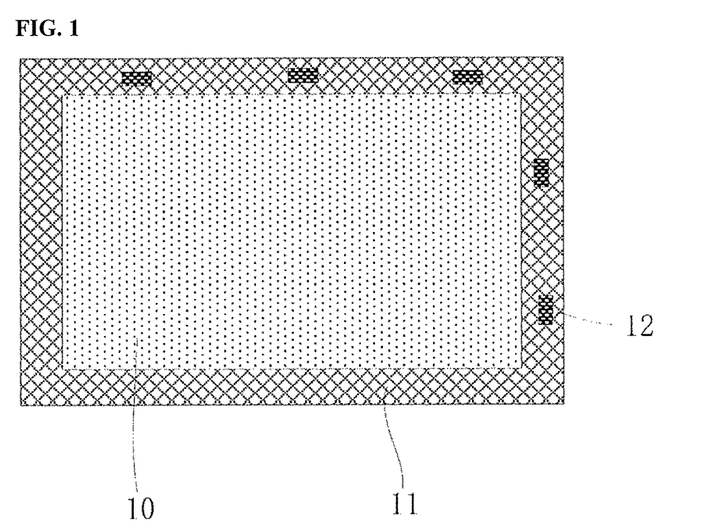
FIG. 1 is a diagram illustrating the structure of a conventional OLED substrate.
Figure 2:
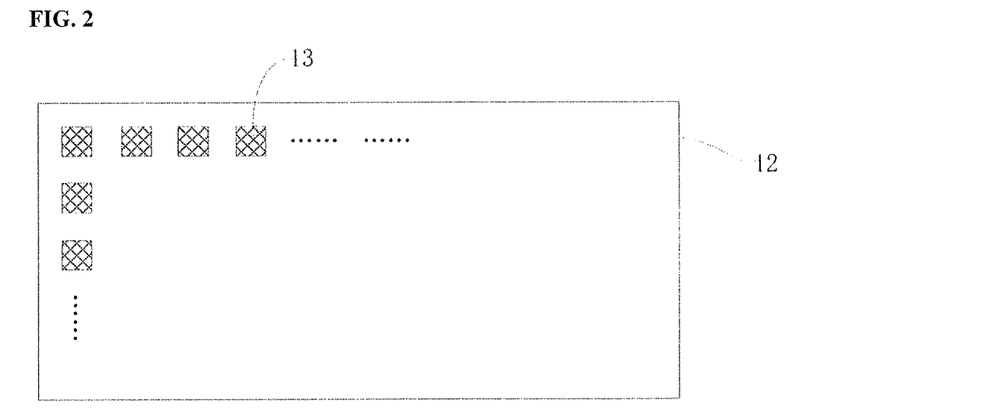
FIG. 2 is a plan view of the cathode contact area of a conventional OLED substrate.
Figure 3:
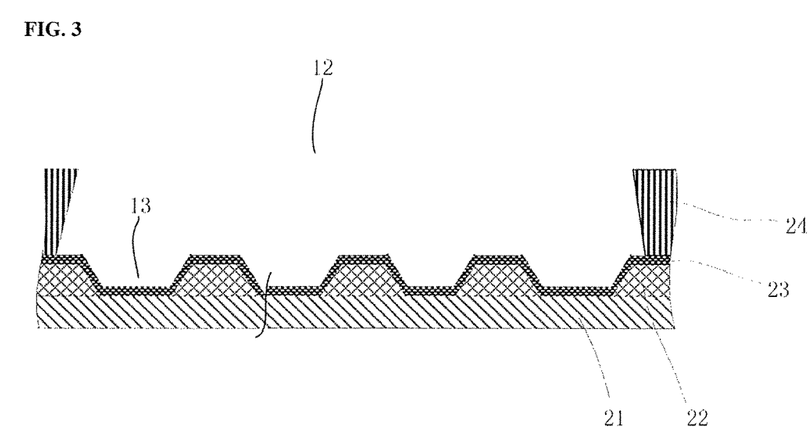
FIG. 3 is a cross-sectional view of the cathode contact area of a conventional OLED substrate.

FIG. 1 is a diagram illustrating the structure of a conventional OLED substrate. FIG. 2 is a plan view of the cathode contact area of a conventional OLED substrate. FIG. 3 is a cross-sectional view of the cathode contact area of a conventional OLED substrate. Referring to FIG. 1, the conventional OLED substrate includes a display region 10 and a peripheral region 11. The peripheral region 11 includes a cathode contact area 12. Referring to FIG. 3, the peripheral region includes a source/drain layer 21, an insulating layer 22, a transparent conductive layer 23, and a pixel definition layer 24. Within the region corresponding to the cathode contact area 12, the pixel definition layer 24 is removed. Within the region corresponding to the cathode contact area 12, the insulating layer 22 includes a plurality of vias 13. The transparent conductive layer 23 is in contact with the source/drain layer 21 through the plurality of vias 13.

The OLED substrate as shown in FIGS. 2 and 3 is subject to subsequent fabrication processes, e.g., printing or coating an organic light emitting layer in between pixel definition units (in a same layer as the pixel definition layer 24) within the display region, cleaning the substrate to remove contamination caused by the ink or coating material (e.g., within the cathode contact area 12), and forming a cathode material layer within the cathode contact area 12. The cathode material layer 12 is connected to the source/drain layer 21 through the transparent conductive layer 23.

Contamination with a small via such as a cathode contact area 12 is difficult to clean. Methods such as plasma etching and laser cleaning do not work for cleaning a via, particularly a via having a size in micro-meter scale. If the contamination within the via is not completely removed, it becomes difficult to gain access to various layers within the via (e.g., the transparent conductive layer).

Figure 4:
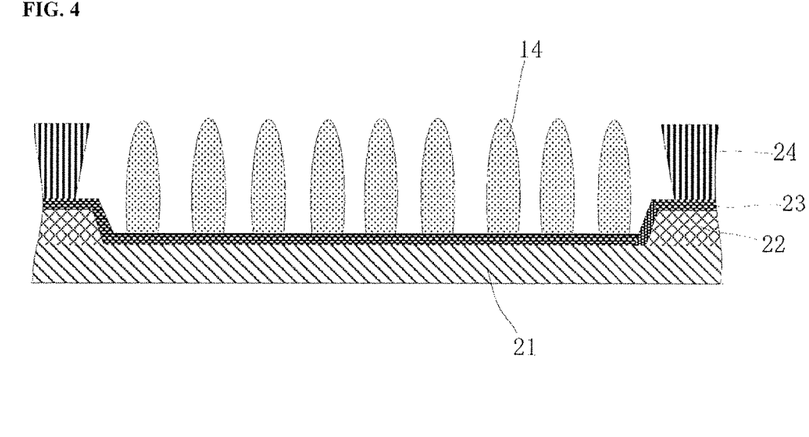
FIG. 4 is a cross-sectional view of the cathode contact area of an OLED substrate in some embodiments.

In another aspect, the present disclosure provides a superior OLED substrate including a peripheral region having a cathode contact area 12. FIG. 4 is a cross-sectional view of the cathode contact area of an OLED substrate in some embodiments. Referring to FIG. 4, in an area within the peripheral region and outside the via, the substrate includes an insulating layer 22, a pixel definition layer 24, and a transparent conductive layer 23 between the insulating layer 22 and the pixel definition layer 24. Within the via, the insulating layer 22 and the pixel definition layer 24 are removed, and the substrate includes a transparent conductive layer 23 and the lyophobic protrusion layer having a plurality of protrusions spaced apart in the via. Optionally, the transparent conductive layer 23 is the bottom surface of the via 14. The end of each of the plurality of protrusions 14 proximal to the transparent conductive layer 23 is in contact with the transparent conductive layer 23.

As compared to the conventional OLED substrate in which the cathode contact area includes a plurality of smaller vias for connecting the transparent conductive layer 23 and the source/drain layer 21, the present OLED substrate has a relatively larger via, i.e., the insulating layer 22 and the pixel definition layer 24 within the cathode contact area 14 are completely removed. The transparent conductive layer 23 is the bottom surface of the via 14. The end of each of the plurality of protrusions 14 proximal to the transparent conductive layer 23 is on and in contact with the transparent conductive layer 23. Optionally, the end distal to the transparent conductive layer 23 is substantially level with a surface of the substrate (e.g., a surface of the pixel definition layer). By having such a plurality of lyophobic protrusions, the contamination within the via can be prevented from entering into the via, obviating the needs for a targeted cleaning within the via.

In some embodiments, the substrate further includes a source/drain layer 21. Outside the via, the source/drain layer 21 is on a side of the insulating layer 22 distal to the transparent conductive layer 23. Within the via, the source/drain layer 21 is on a side of the transparent conductive layer 23 distal to the lyophobic protrusion layer. The source/drain layer 21 is in contact with the transparent conductive layer 23. As compared to the conventional OLED substrate, the contact area between the transparent conductive layer 23 and the source/drain layer 21 is much larger. As a result, the contact resistance is smaller, and the electrical connection more reliable.

In some embodiments, the substrate further includes a cathode material layer on a side of the lyophobic protrusion layer distal to the transparent conductive layer 23. In some embodiments. The cathode material layer extends through a space in between the plurality of protrusions 14 (e.g., the via is filled with the cathode material in between the plurality of protrusions 14). The cathode material layer is in contact with the transparent conductive layer 23, and is connected to the source/drain layer 21 through the transparent conductive layer 23.

In some embodiments, the substrate further includes various other OLED components. Within the display region, the substrate optionally includes an anode layer, a cathode layer, and a light emitting layer between the anode layer and the cathode layer. Optionally, the cathode layer is in a same layer as the cathode material layer. Optionally, the anode layer is in a same layer as the transparent conductive layer 23.

In some embodiments, the lyophobic material is a same material as that of a pixel definition layer 24 (e.g., a fluorine containing organic polymer photoresist). The pixel definition layer 24 includes a plurality of pixel definition units for defining pixels. The organic light emitting material is deposited within a space in between pixel definition units, e.g., by printing or coating. Optionally, the lyophobic protrusion layer is formed in a same process as the pixel definition layer 24, simplifying the manufacturing process.

Figure 5:
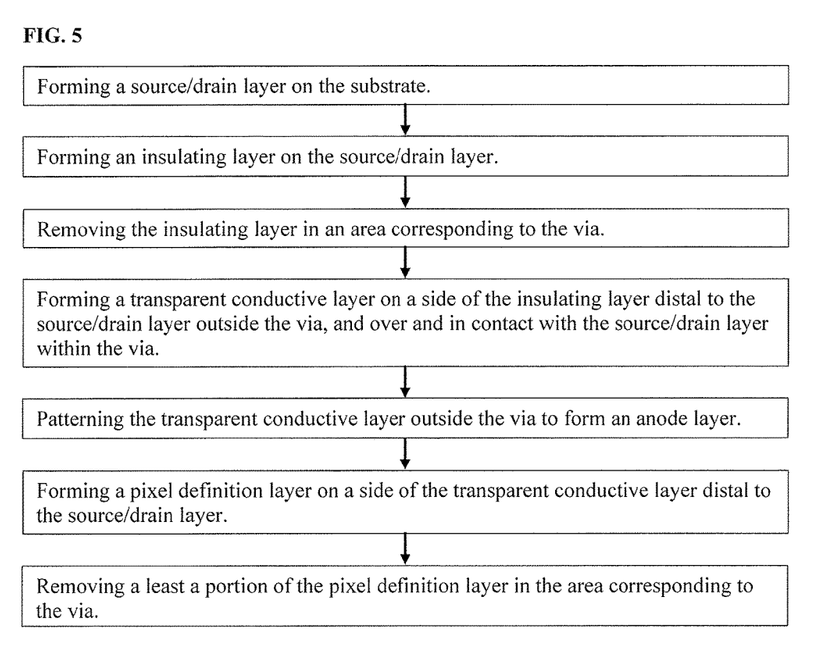
FIG. 5 is a flow chart illustrating a method of fabricating an OLED substrate in some embodiments.

FIG. 5 is a flow chart illustrate a method of fabricating an OLED substrate in some embodiments. Referring to FIG. 5, the via is a cathode contact area in a peripheral region of an organic light emitting display. Prior to forming the lyophobic protrusion layer, the method in the embodiment includes forming a source/drain layer on the substrate, forming an insulating layer on the source/drain layer, removing the insulating layer in an area corresponding to the via, forming a transparent conductive layer on a side of the insulating layer distal to the source/drain layer outside the via, and over and in contact with the source/drain layer within the via, patterning the transparent conductive layer outside the via to form an anode layer, forming a pixel definition layer on a side of the transparent conductive layer distal to the source/drain layer, and removing a least a portion of the pixel definition layer in the area corresponding to the via. The transparent conductive layer within the via is in contact with the source/drain layer. Optionally, the end of each of the plurality of protrusions proximal to the transparent conductive layer is in contact with the transparent conductive layer. The end of each of the plurality of protrusions distal to the transparent conductive layer is substantially level with a surface of the substrate (e.g., a surface of the pixel definition layer). Optionally, the pixel definition layer in the area corresponding to the via is substantially removed.

In some embodiments, the method further includes forming a gate electrode, a gate insulating layer, an active layer, a source electrode, and a drain electrode. Optionally, a gate metal layer (for forming the gate electrode), the gate insulating layer, the source/drain layer (for forming the source electrode and the drain electrode), and/or the active layer extend over to an area corresponding to the cathode contact area.

In some embodiments, the method further includes forming a lyophobic protrusion layer having a plurality of protrusions spaced apart in the via. Optionally, the protrusion is made of a lyophobic material. Optionally, the protrusion has an end proximal to the bottom surface (e.g., in contact with) and an opposite end distal to the bottom surface.

In some embodiments, the method further includes forming a light emitting layer on the substrate by a printing or coating process. Optionally, the method further includes patterning the pixel definition layer to form a plurality of pixel definition units, and forming the light emitting layer within a pixel area defined by the plurality of pixel definition units (e.g., by a printing or coating process).

In some embodiments, the method further includes cleaning the substrate after the printing or coating process.

In some embodiments, the method further includes forming a cathode material layer in the via on a side of the lyophobic protrusion layer distal to the transparent conductive layer. The cathode material layer extends through a space in between the plurality of protrusions and is in contact with the transparent conductive layer. Optionally, the via is filled with the cathode material in between the plurality of protrusions.

In some embodiments, the method further includes forming a cathode layer on a side of the pixel definition layer distal to the source/drain layer. Optionally, the cathode layer is formed in a same process as the cathode material layer.

In some embodiments, the method further includes assembling the substrate into a display panel.

Figure 6:
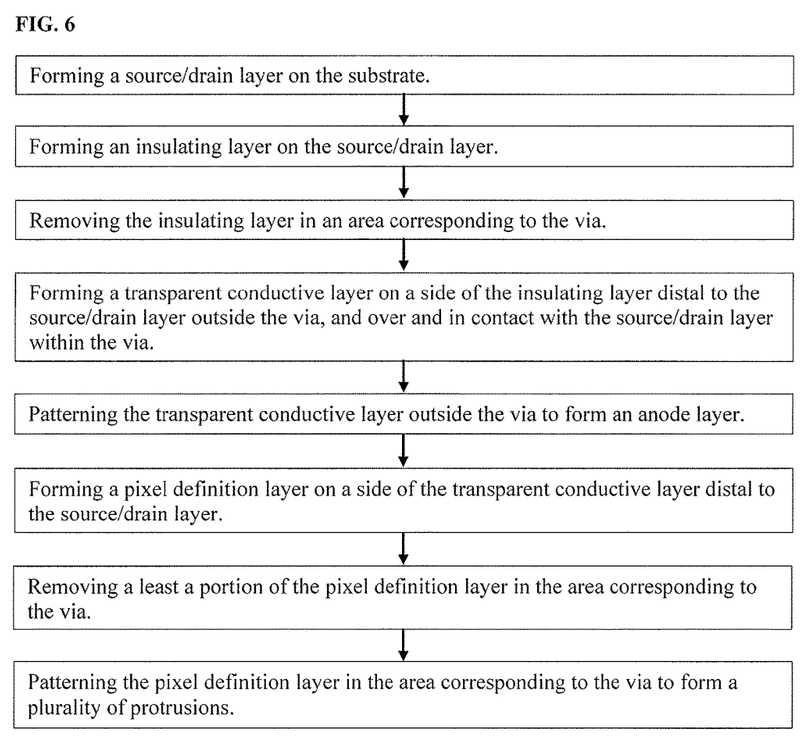
FIG. 6 is a flow chart illustrating a method of fabricating an OLED substrate in some embodiments.

In some embodiments, the lyophobic material is a same material as that of a pixel definition layer, the step of forming the lyophobic protrusion layer includes patterning the pixel definition layer in the area corresponding to the via to form the plurality of protrusions (FIG. 6). Accordingly, the pixel definition units and the lyophobic protrusion layer can be formed in a single process, simplifying the manufacturing process and lowering the manufacturing costs.

Based on the above, the present disclosure provides a method of fabricating an OLED substrate. According to the method in some embodiments, a lyophobic protrusion layer having a plurality of protrusions spaced apart in a cathode contact area is formed in the substrate. The lyophobic protrusions are made of a lyophobic material, coated with a lyophobic material, or otherwise treated to be lyophobic. The lyophobic material repels the ink or coating material. By having a plurality of lyophobic protrusions, the contamination within the via can be prevented, obviating the needs for a targeted cleaning within the via before the substrate is subject to subsequent processes. The manufacturing process is thus significantly simplified, and defects in the substrate much reduced.

In another aspect, the present disclosure provides a display panel having a substrate described herein or fabricated by a method described herein. Examples of appropriate display panels includes an electronic paper, an OLED display panel, a mobile phone, a tablet computer, a television, a monitor, a notebook computer, a digital album, a gps, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A substrate having a via, comprising:
   a base substrate;
   a conductive layer on the base substrate and extending into the via; and
   a lyophobic protrusion layer in the via and on a side of the conductive layer facing away the base substrate;
   wherein the lyophobic protrusion layer comprises a plurality of lyophobic protrusions spaced apart from each other, each of the plurality of lyophobic protrusions protruding away from a surface of the conductive layer;
   ends of the plurality of lyophobic protrusions distal to the conductive layer are lyophobic;
   the plurality of lyophobic protrusions are in direct contact with the conductive layer; and
   portions of the conductive layer spacing apart the plurality of lyophobic protrusions are uncovered by the lyophobic protrusion layer and conductive.

2. The substrate of claim 1, wherein ends of the plurality of lyophobic protrusions distal to the conductive layer are substantially level with a surface of the substrate in regions outside the via.

3. The substrate of claim 1, wherein the via is an electrode contact area in a peripheral region of an organic light emitting display;
   in an area within the peripheral region and outside the via, the substrate comprises an insulating layer on the base substrate, and a pixel definition layer;
   the conductive layer is on a side of the insulating layer distal to the base substrate; and
   the pixel definition layer is on a side of the conductive layer distal to the insulating layer.

4. The substrate of claim 3, wherein the ends of the plurality of lyophobic protrusions distal to the conductive layer are substantially level with a surface of the pixel definition layer outside the electrode contact area.

5. The substrate of claim 3, further comprising a source/drain layer extending into the via;
   wherein a first portion of the source/drain layer within the via is between the conductive layer and the base substrate, and is in direct contact with the conductive layer; and
   a second portion of the source/drain layer outside the via is on a side of the insulating layer distal to the conductive layer.

6. The substrate of claim 5, further comprising a cathode material layer on a side of the lyophobic protrusion layer distal to the conductive layer, the cathode material layer extending through a space in between the plurality of lyophobic protrusions and in contact with the conductive layer.

7. The substrate of claim 6, further comprising an anode layer, a cathode layer, and a light emitting layer between the anode layer and the cathode layer within a display region of the organic light emitting display, the cathode layer is in a same layer as the cathode material layer.

8. The substrate of claim 7, wherein the anode layer is in a same layer as the conductive layer.

9. The substrate of claim 2, wherein adjacent ends of the ends of the plurality of lyophobic protrusions distal to the conductive layer are spaced apart from each other by a distance in a range of about 6 μm to about 10 μm.

10. The substrate of claim 1, wherein the lyophobic material is a same material as that of a pixel definition layer.

11. The substrate of claim 10, wherein the lyophobic material is a fluorine containing organic polymer.

12. A display device, comprising a substrate of claim 1.

13. A method of fabricating a substrate, comprising:
    forming a via in the substrate thereby exposing a conductive layer on a base substrate and extending into the via; and
    forming a lyophobic protrusion layer in the via and on a side of the conductive layer facing away the base substrate;
    wherein forming the lyophobic protrusion layer comprises forming a plurality of lyophobic protrusions spaced apart from each other, each of the plurality of lyophobic protrusions protruding away from a surface of the conductive layer;
    wherein the plurality of lyophobic protrusions are formed so that ends of the plurality of lyophobic protrusions distal to the conductive layer are lyophobic;
    the plurality of lyophobic protrusions are formed to be in direct contact with the conductive layer; and
    the plurality of lyophobic protrusions are formed so that portions of the conductive layer spacing apart the plurality of lyophobic protrusions are uncovered by the lyophobic protrusion layer and conductive.

14. The method of claim 13, further comprising:
    forming a light emitting layer on the substrate by a printing or coating process.

15. The method of claim 13, wherein the plurality of lyophobic protrusions are formed so that ends of the plurality of lyophobic protrusions distal to the conductive layer are substantially level with a surface of the substrate.

16. The method of claim 13, wherein the via is an electrode contact area in a peripheral region of an organic light emitting display, prior to forming the lyophobic protrusion layer, the method further comprising:
    forming a source/drain layer on the substrate;
    forming an insulating layer on the source/drain layer;
    removing the insulating layer in an area corresponding to the electrode contact area;
    forming a conductive layer, the conductive layer being formed on a side of the insulating layer distal to the source/drain layer outside the via, and being formed on a side of the source/drain layer distal to the base substrate and in direct contact with the source/drain layer within the via;
    patterning the conductive layer outside the via to form an anode layer;

forming a pixel definition layer on a side of the conductive layer distal to the source/drain layer; and removing a least a portion of the pixel definition layer in the area corresponding to the via.

17. The method of claim 16, wherein the plurality of lyophobic protrusions are formed so that the ends of the plurality of lyophobic protrusions distal to the conductive layer are substantially level with a surface of the pixel definition layer outside the electrode contact area.

18. The method of claim 16, wherein the lyophobic material is a same material as that of a pixel definition layer, the step of forming the lyophobic protrusion layer comprises patterning the pixel definition layer in the area corresponding to the via to form the plurality of lyophobic protrusions.

19. The method of claim 18, further comprising forming a light emitting layer on the substrate by a printing or coating process on a side of the pixel definition layer distal to the source/drain layer.

20. The method of claim 19, further comprising forming a cathode material layer in the via on a side of the lyophobic protrusion layer distal to the transparent conductive layer, the cathode material layer extending through a space in between the plurality of lyophobic protrusions and in contact with the transparent conductive layer.

* * * * *